United States Patent [19]
Patti

[11] Patent Number: 6,141,261
[45] Date of Patent: Oct. 31, 2000

[54] DRAM THAT STORES MULTIPLE BITS PER STORAGE CELL

[76] Inventor: Robert Patti, 1 S. 751 Avon Dr., Warrenville, Ill. 60555

[21] Appl. No.: 09/476,625

[22] Filed: Dec. 31, 1999

[51] Int. Cl.[7] ...................................................... G11C 7/00
[52] U.S. Cl. ........................ 365/189.07; 365/45; 365/210
[58] Field of Search ................................ 365/189.07, 45, 365/210

[56] References Cited

U.S. PATENT DOCUMENTS 5,847,991   12/1998   Tong et al. ........................ 365/185.03

*Primary Examiner*—Vu A. Le
*Attorney, Agent, or Firm*—Calvin B. Ward

[57] ABSTRACT

A memory constructed from a plurality of data storage words. Each data storage word includes a plurality of data storage cells and a plurality of reference storage cells, each data storage cell and each reference storage cell having at least 4 states. The memory has a plurality of reference lines, one such reference line corresponding to each reference storage cell. The corresponding reference storage cell is connected to that reference line by a gate included in that storage cell. Each reference cell assumes one of the states in response to a signal on the corresponding reference line and a write signal, the state being determined by the signal on the corresponding reference line. The memory also includes a plurality of data lines, one such data line corresponding to each data storage cell, the corresponding data storage cell being connected to that data line by a gate in that storage cell. Each data cell assumes one of the states in response to a signal on the corresponding data line and a write signal, the state being determined by the signal on the corresponding data line. A plurality of reference encoding circuits determines the state stored by each reference cell, there being one such reference encoding circuit corresponding to each reference line. The preferred data storage cell includes first, second, and third gates, and a capacitor for storing a charge that determines the current sinked by the third gate. The preferred data encoding circuit utilizes a current-mode digital to analog converter. Data is read from the memory by a plurality of data decoding circuits that generate a digital value representing the current flowing in the corresponding data line by comparing that current to currents flowing in each of the reference lines.

5 Claims, 4 Drawing Sheets ately available DRAMs store one bit in each
DRAM THAT STORES MULTIPLE BITS PER STORAGE CELL

FIELD OF THE INVENTION

The present invention relates to memory systems, and more particularly, to a DRAM architecture that allows multiple bits to be stored in each memory cell.

BACKGROUND OF THE INVENTION

Dynamic random-access memories (DRAMs) provide the bulk of the semiconductor-based memories on most computer systems. A DRAM stores data in the form of charge that is stored on a capacitor within the memory cell. The current commerci memory cell, which consists of a transistor and a capacitor. The cost per bit stored is determined by the size of the memory cell. Hence, the prior art has achieved cost reductions in DRAMs by reducing the size of the transistor and capacitor.

A second method for reducing the cost of DRAM storage is to utilize memory cells that can store multiple bits per memory cell. To store N bits per memory cell, each memory cell must provide $2^N$ discrete distinguishable states. In general, the states correspond to the charge stored on a capacitor. The maximum number of bits that can be stored depends on the sensitivity of the circuits used to measure the stored charge and on the ability of the write circuits to precisely control the amount of charge that is stored on the capacitor. Prior art multilevel DRAMS have been limited to two or three bits per storage cell.

The amount of charge that leaks off of the capacitor is a non-linear function of the amount of charge that was stored on the capacitor during programming. To compensate for the charge leakage, reference cells that are written at the same time as the storage cells are programmed with predetermined data values. Hence, the size of a "word" that stores M bits of data must be increased by the number of reference cells needed to read the data in that word. At the time the data is read from the storage cells, it is compared to the values in the reference cells. If the number of storage levels is relatively small, a reference cell can be included for each possible data value. However, this strategy fails if the number of storage levels is high. For example, if each storage cell stores 8 bits, than each word would require 256 reference cells. Any savings realized by storing multiple bits per memory cell would be consumed by the additional reference cells.

Broadly, it is the object of the present invention to provide an improved multilevel DRAM memory.

It is a further object of the present invention to provide a DRAM memory that does not require one reference cell per storage level.

These and other objects of the present invention will become apparent to those skilled in the art from the following detailed description of the invention and the accompanying drawings.

SUMMARY OF THE INVENTION

The present invention is a memory constructed from a plurality of data storage words. Each data storage word includes a plurality of data storage cells and a plurality of reference storage cells, each data storage cell and each reference storage cell having at least 4 states. The memory has a plurality of reference lines, one such reference line corresponding to each reference storage cell. The corresponding reference storage cell is connected to that reference line by a gate included in that storage cell. Each reference cell assumes one of the states in response to a signal on the corresponding reference line and a write signal, the state being determined by a signal on the corresponding reference line. The memory also includes a plurality of data lines, one such data line corresponding to each data storage cell, the corresponding data storage cell being connected to that data line by a gate in that storage cell. Each data cell assumes one of the states in response to a signal on the corresponding data line and a write signal, the state being determined by the signal on the corresponding data line. A plurality of reference encoding circuits determines the state stored by each reference cell, there being one such reference encoding circuit corresponding to each reference line. Each reference encoding cell is connected to that reference line, each reference encoding circuit generating a reference signal on the corresponding reference line in response to the write signal. A plurality of data encoding circuits determines the data values stored in the data storage cells, there being one such data encoding circuit corresponding to each data line. Each data encoding circuit includes a circuit for receiving a digital value having at least 4 states and for generating a data programming signal on the corresponding data line in response to the write signal. The preferred data storage cell includes first, second, and third gates, and a capacitor for storing a charge that determines the current sinked by the third gate. The first gate connects the third gate to the corresponding data line and the second gate connects the capacitor to the corresponding data line. The preferred data encoding circuit utilizes a current-mode digital to analog converter to set the current that flows through the corresponding data line. Data is read from the memory by a plurality of data decoding circuits, one such data decoding circuit corresponding to each data line. Each data decoding circuit includes a current-mode analog to digital converter for generating a digital value representing the current flowing in the corresponding data line by comparing that current to currents flowing in each of the reference lines. In the preferred embodiment of the present invention, the current-mode analog to digital converter utilizes a piecewise linear curve defined by the currents flowing in each of the reference lines.

DETAILED DESCRIPTION OF THE INVENTION

Figure 1:
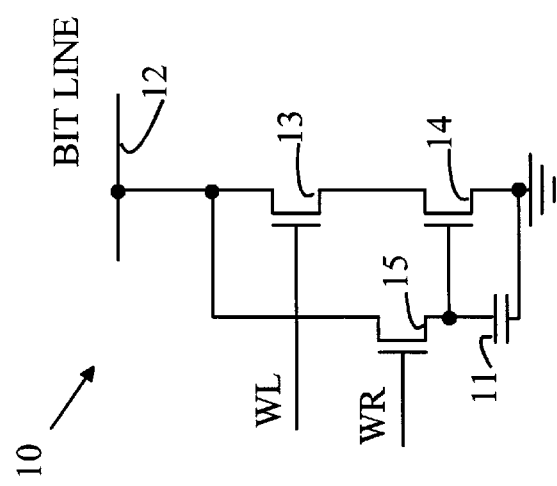
FIG. 1 is a schematic drawing of a storage cell 10 according to the present invention.

Refer now to FIG. 1 which is a schematic drawing of a storage cell 10 according to the present invention. Storage cell 10 stores an analog value by storing charge on a capacitor 11. In general, the data to be stored or written is presented as an analog current on a bit line 12. Select transistor 13 connects storage cell 10 to the bit line. The current sinked by storage cell 10 depends on the charge stored on capacitor 11. Data is written into capacitor 11 by connecting capacitor 10 to the bit line via gate 15.

Figure 2:
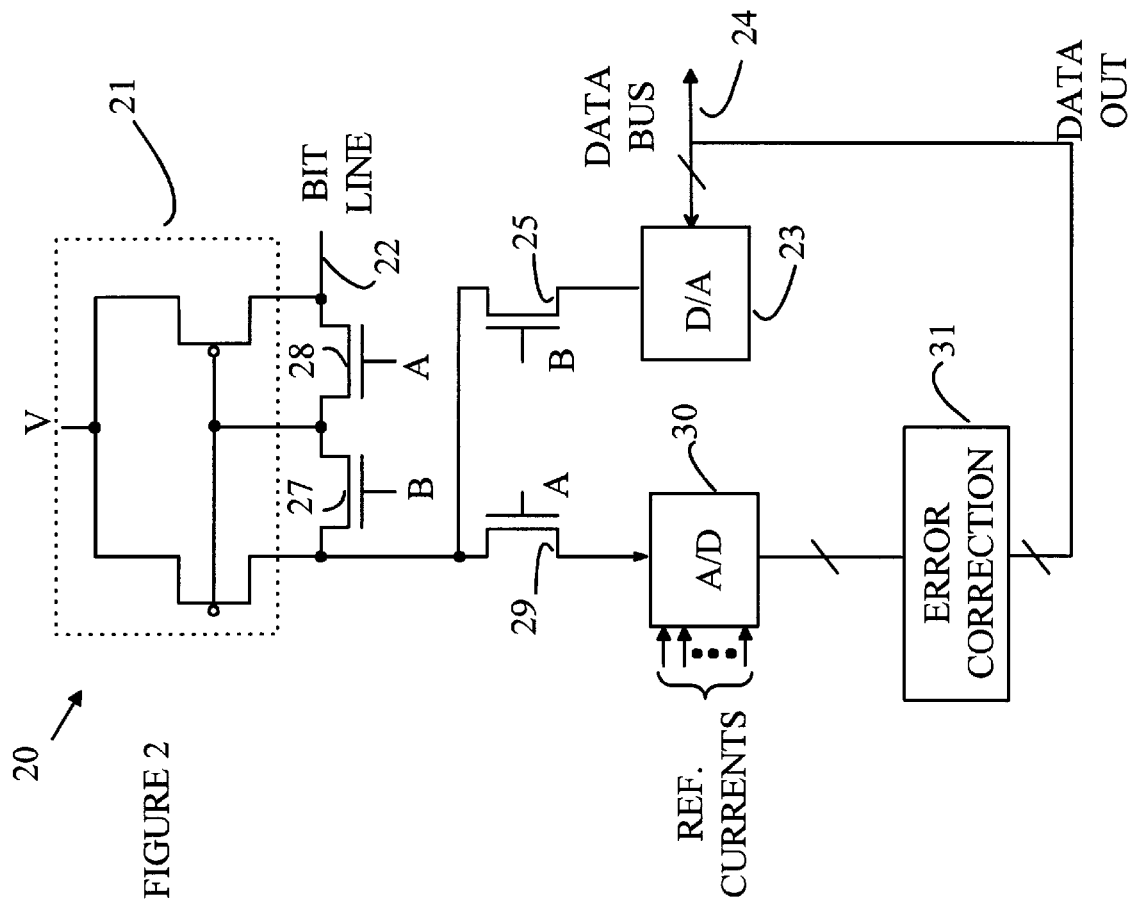
FIG. 2 is a schematic drawing of an encode/decode circuit 20 according to the present invention.

The manner in which a multi-bit data value is stored in storage cell 10 may be more easily understood with reference to FIG. 2 which is a schematic drawing of an encode/decode circuit 20 according to the present invention. To write data into a storage cell connected to a bit line 22, circuit 21 utilizes a current mirror 21 to generate a current in bit line 22 that is proportional to the multi-bit digital value on data bus 24. A current based digital to analog converter 23 converts the digital value to an analog current that is coupled to current mirror 21 through gate 25. During a write, gates 25 and 27 are conducting and gates 28 and 29 are non-conducting. The current generated by D/A is thus transferred to bit line 22 and a charge sufficient to cause the corresponding storage cell to sink that current is stored on the capacitor in the storage cell.

Data is read from a storage cell by an analogous process. During a read, gates 28 and 29 are conducting while gates 25 and 27 are non-conducting. The cell that is to be read is connected to bit line 22. Current mirror 21 causes a current proportional to that being sinked by the storage cell to flow in current based A/D 30 which digitizes the current with reference to a number of reference currents. The generation of these reference currents will be discussed in detail below. The value generated by A/D is then corrected for any errors using a conventional CDC error correcting circuit 31 before being placed on data bus 24.

Once data is stored in a storage cell, the charge on the capacitor begins to leak off. It should be noted that the rate of charge leakage from the capacitor depends on the amount of charge stored. Hence, a non-linear correction is needed. The present invention utilizes a correction mechanism that represents the non-linear correction curve as a piece-wise linear curve.

Figure 3:
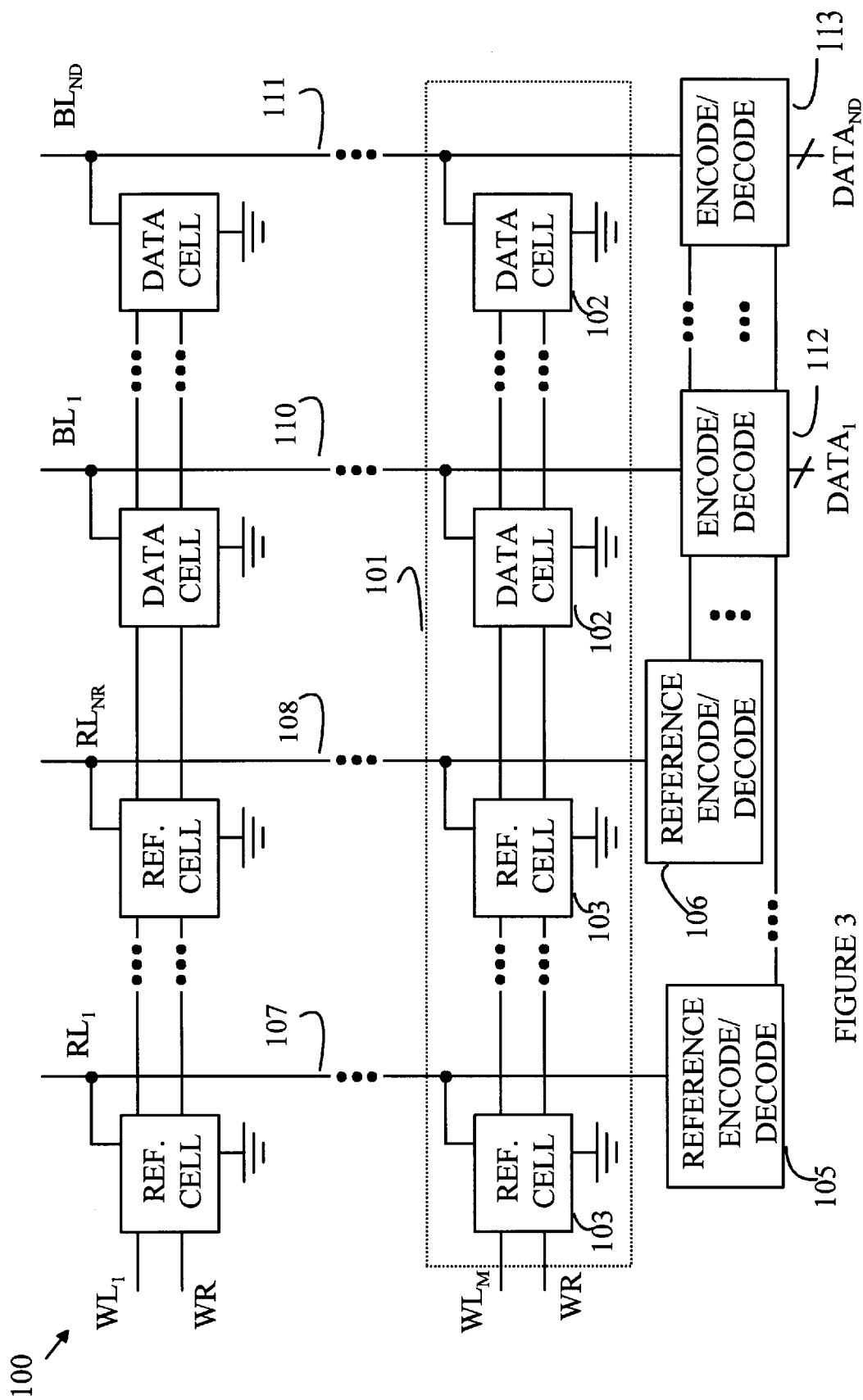
FIG. 3 is a block diagram of a memory 100 according to the present invention.

Refer now to FIG. 3 which is a block diagram of a memory 100 according to the present invention. Memory 100 is organized into words. An exemplary word is shown at 101. Each word includes ND data storage cells that are used to store digital values. Each data storage cell stores a plurality of bits and is based on a storage cell such as storage cell 10 discussed above. The total number of bits stored in each word is ND times the number of bits stored in each data storage cell. Exemplary data storage cells are shown at 102. The analog data read into, and out of, the data storage cells is connected to encode/decode circuits via bit lines as discussed above with reference to FIG. 2. Exemplary bit lines are shown at 110 and 111. These bit lines are connected to encode/decode circuits 112 and 113, respectively.

Each word also includes NR reference storage cells that are read and written at the same time the data storage cells are read and written. Exemplary reference storage cells are shown at 103 in word 101. During a write operation, the values stored in the reference storage cells are determined by reference current generators contained in the reference encode/decode circuits that are attached to the reference lines. Exemplary reference encode/decode circuits are shown at 105 and 106 connected to reference lines 107 and 108, respectively. During a read operation, the reference encode/decode circuits provide the calibration currents used by the data encode/decode circuits to correct for charge leakage from the capacitors in the data storage cells.

Figure 4:
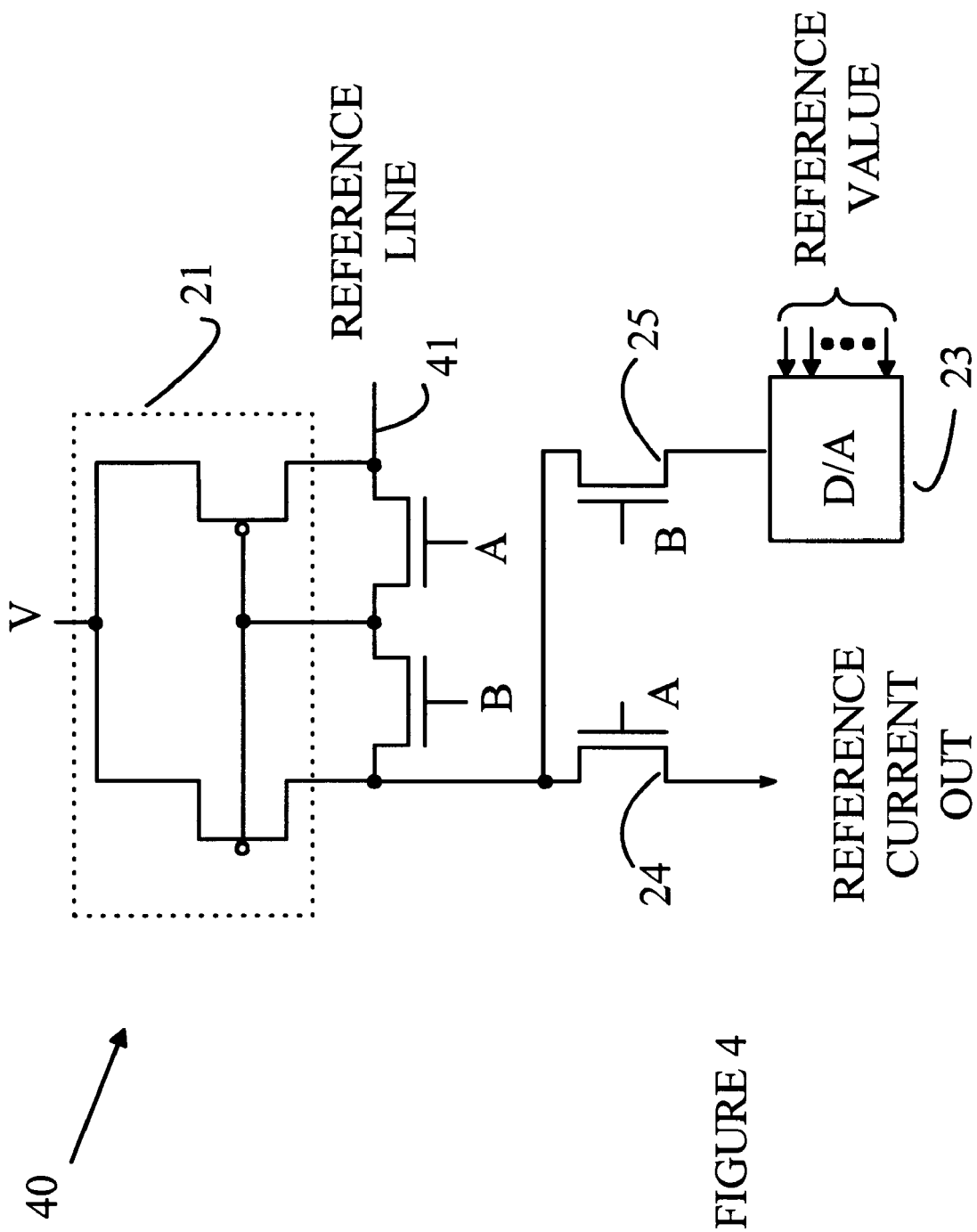
FIG. 4 is a schematic drawing of a reference encode/decode circuit 40 according to the present invention.

Refer now to FIG. 4 which is a schematic drawing of a reference encode/decode circuit 40 according to the present invention. Reference encode/decode circuit 40 operates in a manner analogous to that discussed above with reference to encode/decode circuit 20 shown in FIG. 2. Accordingly, those elements of reference encode/decode circuit 40 that serve the same functions as elements discussed with reference to FIG. 2 have been given the same numeric designations in FIG. 4. Reference encode/decode circuit 40 receives a single fixed wired calibration value that is input to D/A 23 during a write operation. Each reference cell in a word is programmed with a different calibration value. The resulting current value is placed on reference line 41 by current mirror 21. During a read operation, current mirror 21 generates a reference current indicative of the charge still remaining on the capacitor in the reference storage cell connected to reference line 41. This reference current is fed to each of the data encode/decode circuits along with the reference current values generated by the other reference encode/decode circuits in memory 100.

Figure 5:
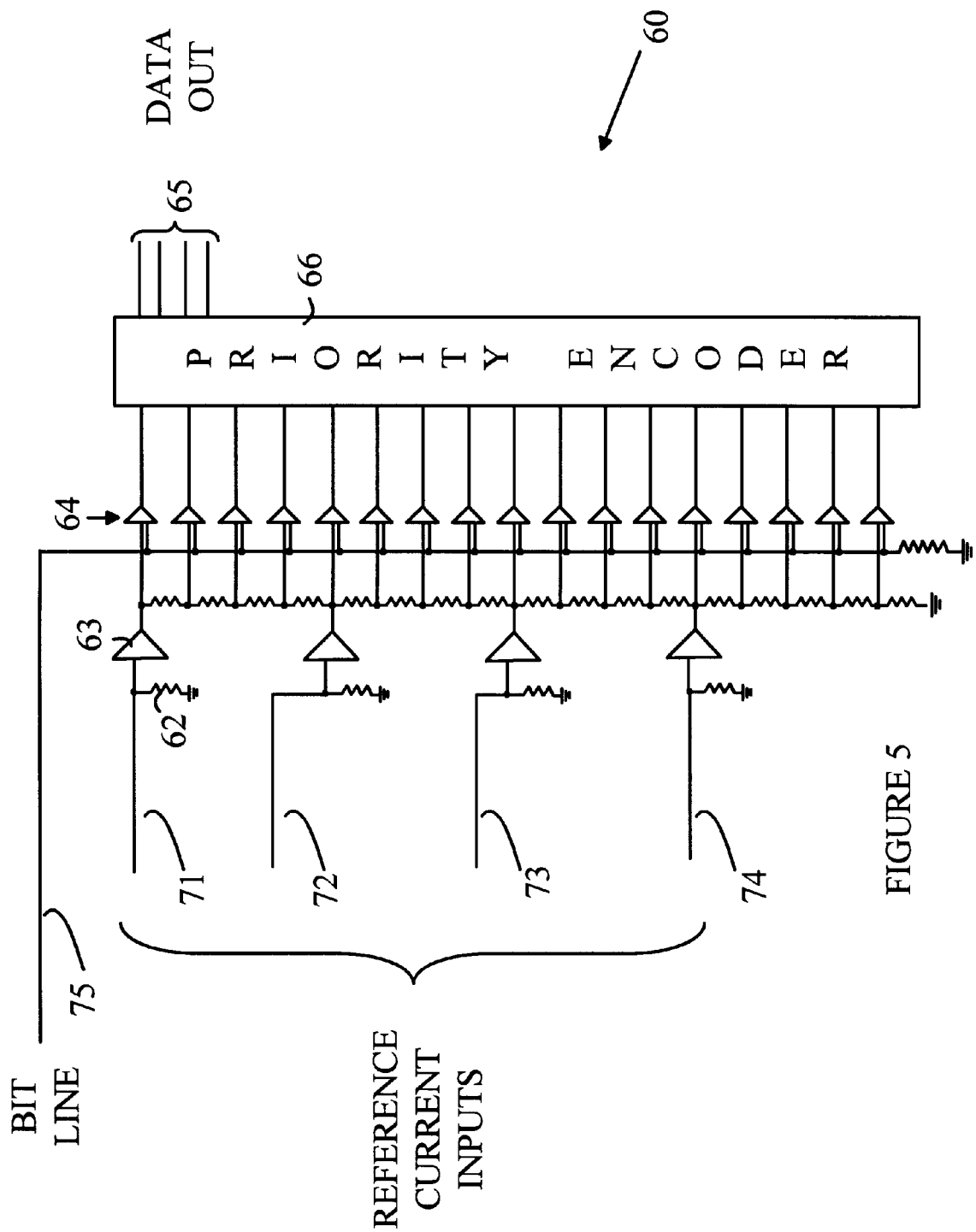
FIG. 5 is a schematic drawing of one embodiment of a current A/D circuit that performs the piece-wise linear correction.

As noted above, the rate of charge leakage from the capacitors depends on the amount of charge stored on the capacitor. Hence, a non-linear correction is needed. The present invention utilizes a correction mechanism that represents the non-linear correction curve as a piece-wise linear curve. Refer now to FIG. 5 which is a schematic drawing of one embodiment of a current A/D circuit that performs the piece-wise linear correction. A/D converter 60 can be used for A/D converter 30 shown in FIG. 2. To simplify the following discussion, it will be assumed that each data storage cell stores 4 bits and that there are 4 reference storage cells in each word. In this case, the first reference cell is programmed with 1111, the second reference cell with 1011, the third reference cell with 0111, and the fourth reference cell with 0011. The outputs of the reference encode/decode circuits from the corresponding 4 reference lines are input to A/D 60 on lines 71–74, respectively. The current generated from the bit line connected to the encode/decode circuit containing A/D 60 is connected to line 75. The current on bit line 75 is compared to 16 points taken on a piecewise linear curve having four non-linear points defined by reference cell currents on lines 71–74. The comparison is accomplished by converting each of the currents generated by the reference cells to a voltage by passing the current through a resistor such as resistor 62. The resulting voltage is applied to a string of 4 resistors via a unity gain drive circuit 63 to provide four points on the linear curve. The points are compared to the voltage generated by the current on the bit line by 15 comparators shown at 64. The results of the comparisons are decoded by a priority encoder 66 to produce the output value 65.

Various modifications to the present invention will become apparent to those skilled in the art from the foregoing description and accompanying drawings. Accordingly, the present invention is to be limited solely by the scope of the following claims.

What is claimed is:

1. A memory comprising:
   a plurality of data storage words, each data storage word comprising a plurality of data storage cells and a plurality of reference storage cells, each data storage cell and each reference storage cell having at least 4 states;
   a plurality of reference lines, one such reference line corresponding to each reference storage cell, said corresponding reference storage cell being connected to that reference line, each reference storage cell comprising a gate for connecting that storage cell to said corresponding reference line, each reference cell assuming one of said states in response to a signal on said corresponding reference line and a write signal, said state being determined by said signal on said corresponding reference line;

a plurality of data lines, one such data line corresponding to each data storage cell, said corresponding data storage cell being connected to that data line, each data storage cell comprising a gate for connecting that storage cell to said corresponding data line, each data cell assuming one of said states in response to a signal on said corresponding data line and a write signal, said state being determined by said signal on said corresponding data line;

a plurality of reference encoding circuits, one such reference encoding circuit corresponding to each reference line and being connected to that reference line, each reference encoding circuit generating a reference signal on said corresponding reference line in response to said write signal; and a plurality of data encoding circuits, one such data encoding circuit corresponding to each data line and being connected to that data line, each data encoding circuit comprising a circuit for receiving a digital value having at least 4 states and for generating a data programming signal on said corresponding data line in response to said write signal.

2. The memory of claim 1 wherein said data storage cells comprise a first gate for connecting said storage cell to one of said data lines, a capacitor, a second gate for connecting said capacitor to that data line, and a third gate having a base connected to said capacitor, said third gate sinking a current determined by said charge on said capacitor when said third gate is connected to said data line.

3. The memory of claim 1 wherein said data encoding circuit comprises a current-mode digital to analog converter.

4. The memory of claim 1 further comprising a plurality of data decoding circuits, one such data decoding circuit corresponding to each data line and being connected to that data line, each data decoding circuit comprising a current mode analog to digital converter for generating a digital value representing the current flowing in said corresponding data line by comparing that current to currents flowing in each of said reference lines.

5. The memory of claim 4 wherein said current mode analog to digital converter utilizes a piecewise linear curve defined by said currents flowing in each of said reference lines.

* * * * *